United States Patent
Kuo

(10) Patent No.: US 6,898,127 B2
(45) Date of Patent: May 24, 2005

(54) METHOD FOR FABRICATING EMBEDDED FLASH ROM STRUCTURE HAVING CODE CELLS AND DATA CELLS AND OPERATIONS FOR THE SAME

(75) Inventor: Tung-Cheng Kuo, Yilan Hsien (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/112,311

(22) Filed: Mar. 27, 2002

(65) Prior Publication Data

US 2003/0107922 A1 Jun. 12, 2003

(30) Foreign Application Priority Data

Dec. 6, 2001 (TW) ........................................ 90130185 A

(51) Int. Cl.$^7$ ............................................. G11C 16/04
(52) U.S. Cl. ............................. 365/185.28; 365/185.05; 365/185.18
(58) Field of Search ........................ 365/185.28, 185.5, 365/185.18

(56) References Cited

U.S. PATENT DOCUMENTS

| | | | | |
|---|---|---|---|---|
| 5,872,994 A | * | 2/1999 | Akiyama et al. | 712/43 |
| 5,896,316 A | * | 4/1999 | Toyoda | 365/185.02 |
| 6,285,574 B1 | * | 9/2001 | Eitan | 365/63 |
| 6,421,267 B1 | * | 7/2002 | Kuo et al. | 365/63 |
| 2002/0176291 A1 | * | 11/2002 | Cheung et al. | 365/200 |
| 2003/0107092 A1 | * | 6/2003 | Chevallier | 257/390 |

* cited by examiner

Primary Examiner—David Nelms
Assistant Examiner—Ly Duy Pham
(74) Attorney, Agent, or Firm—J.C. Patents

(57) ABSTRACT

A method for fabricating an embedded flash ROM structure having code cells and data cells. A substrate is provided and then a plurality of bit lines are formed over the substrate. A plurality of isolation structures are formed over the bit lines and a charge trapping layer is formed between the isolation structures. A plurality of word lines are formed over the isolation structures and the charge trapping layer to form the embedded flash ROM structure. According to requirement, embedded flash ROM structure is divided into a code cell region and a data cell region.

1 Claim, 8 Drawing Sheets

US 6,898,127 B2

METHOD FOR FABRICATING EMBEDDED FLASH ROM STRUCTURE HAVING CODE CELLS AND DATA CELLS AND OPERATIONS FOR THE SAME

CROSS-REFERENCE TO RELATED APPLICATION

This application claims the priority benefit of Taiwan application serial no. 90130185, filed Dec. 6, 2001.

BACKGROUND OF THE INVENTION

1. Field of the Invention

This invention relates in general to a method for fabricating a non-volatile memory and its operations, and more specifically relates to a method for fabricating an embedded flash ROM structure having code cells and data cells and operations for the same.

2. Description of Related Art

Generally, in a flash ROM array having memory cells having a insulating layer as a charge trapping layer, it usually comprises a code cell region and a data cell region. Each code cell can only store only one-bit data, and therefore its storage capacity is lower but high operation speed is its advantage. In contrast, two-bit data can be stored in each data cell, having the advantage of high storage capacity. The data cells are usually operated in a page program mode or a page read mode. However, if the data cells are operated in single read and program modes, it becomes slower.

As the foregoing description, the structure and the operation are different between the code cells and the data cells. For example, one data cell can store two bits while the code cell can only store one bit. Namely, the specification between the code and the data cells are different. Therefore, the present technology cannot provide a single process to manufacture a flash ROM structure having the code and the data cell regions at the same time because of their different specifications. In order to form a flash ROM structure having the code and the data cell regions, it requires two separated processes to form the code cell region and the data cell region respectively. Additionally, due to the operations of the code cell, it cannot use the process for making the data cell to form the code cell.

Therefore, according to the conventional technology, the manufacturing process for making the flash ROM structure having the code and the data cell regions becomes complex and the cost also increases. Furthermore, because two different processes are required to form such a structure above, the produce yield is reduced if some thing is wrong with the integration of the processes.

SUMMARY OF THE INVENTION

According to the foregoing description, an object of this invention is to provide a method for fabricating an embedded flash ROM structure having code cells and data cells and operations for the same, thereby the code cells and data cells in the flash ROM structure can be formed by a single and same process.

Another object of this invention is to provide a method for fabricating an embedded flash ROM structure having code cells and data cells and operations for the same. A cell that electrons are stored near the source/drain sides can be used as a two-bit data cell with a high storage capacity. In addition, a symmetrical dual channel structure can be used as a code cell so that electrons are stored at two edges of a bit line. Therefore, by applying the same read voltages to the code cell, the read current of the code cell is doubled.

According to the objects mentioned above, the invention provides a method for fabricating an embedded flash ROM structure having code cells and data cells. A substrate is provided and then a plurality of bit lines are formed over the substrate. A plurality of isolation structures are formed over the bit lines and a charge trapping layer is formed between the isolation structures. A plurality of word lines are formed over the isolation structures and the charge trapping layer to form the embedded flash ROM structure. According to requirement, embedded flash ROM structure is divided into a code cell region and a data cell region.

The isolation structures above can be buried oxide layers for example. In addition, the charge trapping layer can be a three-layered insulating structure, such as an oxide-nitride-oxide (ONO) structure.

The invention further provides program, erase and read operations for code cells of an embedded flash ROM structure. The code cell has a first bit line and a word line connected to the code cell, and a second and a third bit lines are located at two sides of the first bit line. When the code cell is programmed, a negative high voltage is applied to the first bit line and a positive high voltage is applied to the word line, and in addition the second and the third bit lines are biased at zero voltages. When the code cell is erased, a positive high voltage is applied to the first bit line and a negative high voltage is applied to the word line, and in addition the second and the third bit lines are biased at zero voltages. During reading the code cell, a first read voltage is applied to the word line and a second read voltage is applied to the second and the third bit lines, and in addition the first is biased at a voltage of zero.

According to the operation methods above, each code cell has a dual channel structure. Using the operation methods of the code cell of the invention, the process for forming the data cell can be also used for forming the code cell. Namely, a single and the same process can be used for simultaneously forming the code cell and the data cell of the flash ROM array.

BRIEF DESCRIPTION OF THE DRAWINGS

While the specification concludes with claims particularly pointing out and distinctly claiming the subject matter which is regarded as the invention, the objects and features of the invention and further objects, features and advantages thereof will be better understood from the following description taken in connection with the accompanying drawings in which:

DESCRIPTION OF THE PREFERRED EMBODIMENT

Figure 1A:
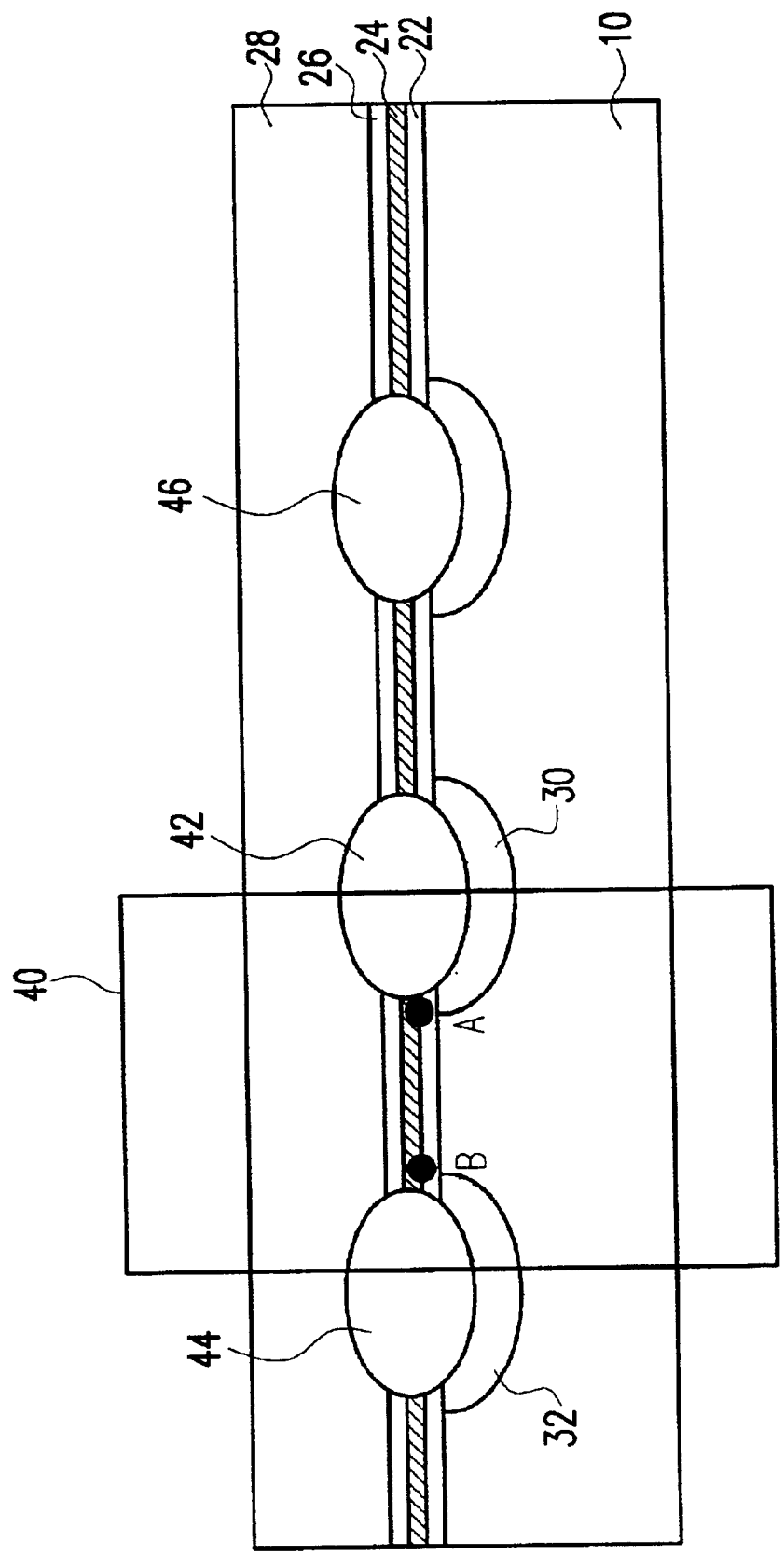
FIG. 1A shows a schematic cross-sectional view of a data cell in a flash ROM array.
Figure 1B:
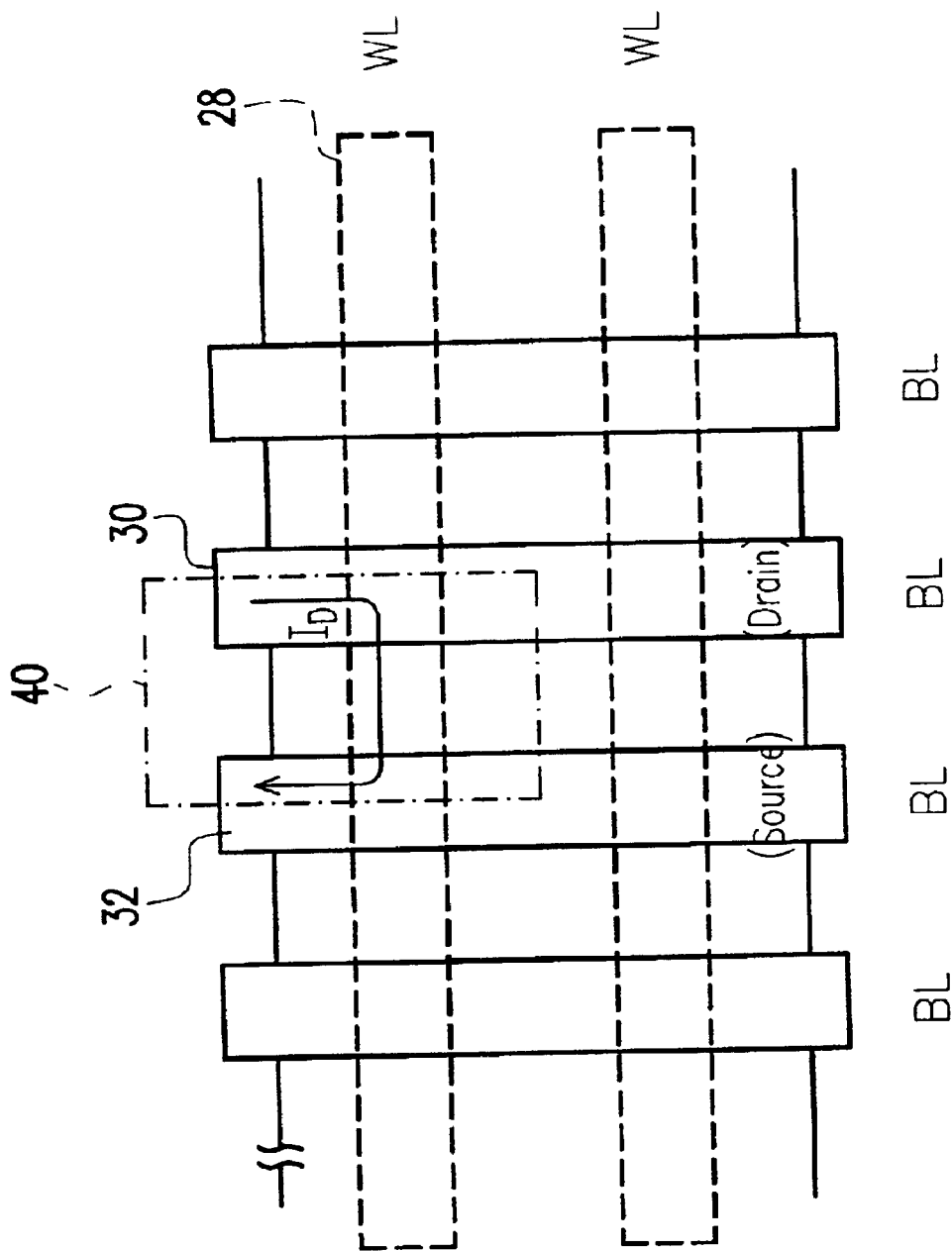
FIG. 1B shows a top view of the data cell in FIG. 1A.

FIG. 1A shows a schematic cross-sectional view of a data cell in a flash ROM array. FIG. 1B shows a top view of the data cell in FIG. 1A.

As shown in FIG. 1A, a data cell 50 is formed on a substrate 10. An oxide-nitride-oxide (ONO) layer, consisting of an oxide layer 22, a nitride layer 24 and an oxide layer 26, is formed on the substrate 10. The material of the oxide layers 22, 26 can be silicon oxide and the oxide layer 22 is used as a tunneling oxide layer. The material of the nitride layer 24 is silicon nitride for example and the nitride layer 24 is used as a charge trapping layer. Electrons in the channel under the ONO layer can be injected into the nitride layer 24 by a large electric field between the gate 28 (word line) and the drain 30. Because the nitride layer 24 is an insulating layer, the trapped electrons are localized near the side of the drain 30 or the source 32, rather than uniformly distributed. For example, the electrons are localized at positions A and B in FIG. 1A. Therefore, for a data cell, two bits can be stored in a single data cell 50. In FIG. 1A, the drain 30 and source 32 can be formed under isolation structures 42, 44 respectively. In general, the isolation structure 42, 44 can be buried oxide layers.

As shown in FIG. 1B, it shows a top view the structure in FIG. 1A. Referring to FIG. 2B, a flash ROM array consists of a plurality of word lines and bit lines. When it intends to program electrons to a data cell, the bit line 30 near the electrons to be programmed into is served as a drain, and the other bit line 32 is served as a source. Then, proper programming voltages are applied to the gate 28 (word line) and the drain 30, and then the electrons are injected to the nitride layer 24 near the drain side 30 of the data cell 50. In addition, when the data cell 50 is read, proper read voltages are applied to the gate (word line) 28, the source 32 and the drain 30. At this time, a read current $I_D$ flows through the channel under the ONO layer from the source 32 to the drain 30. By measuring the read current $I_D$, the programmed/erased state can be detected.

Figure 2A:
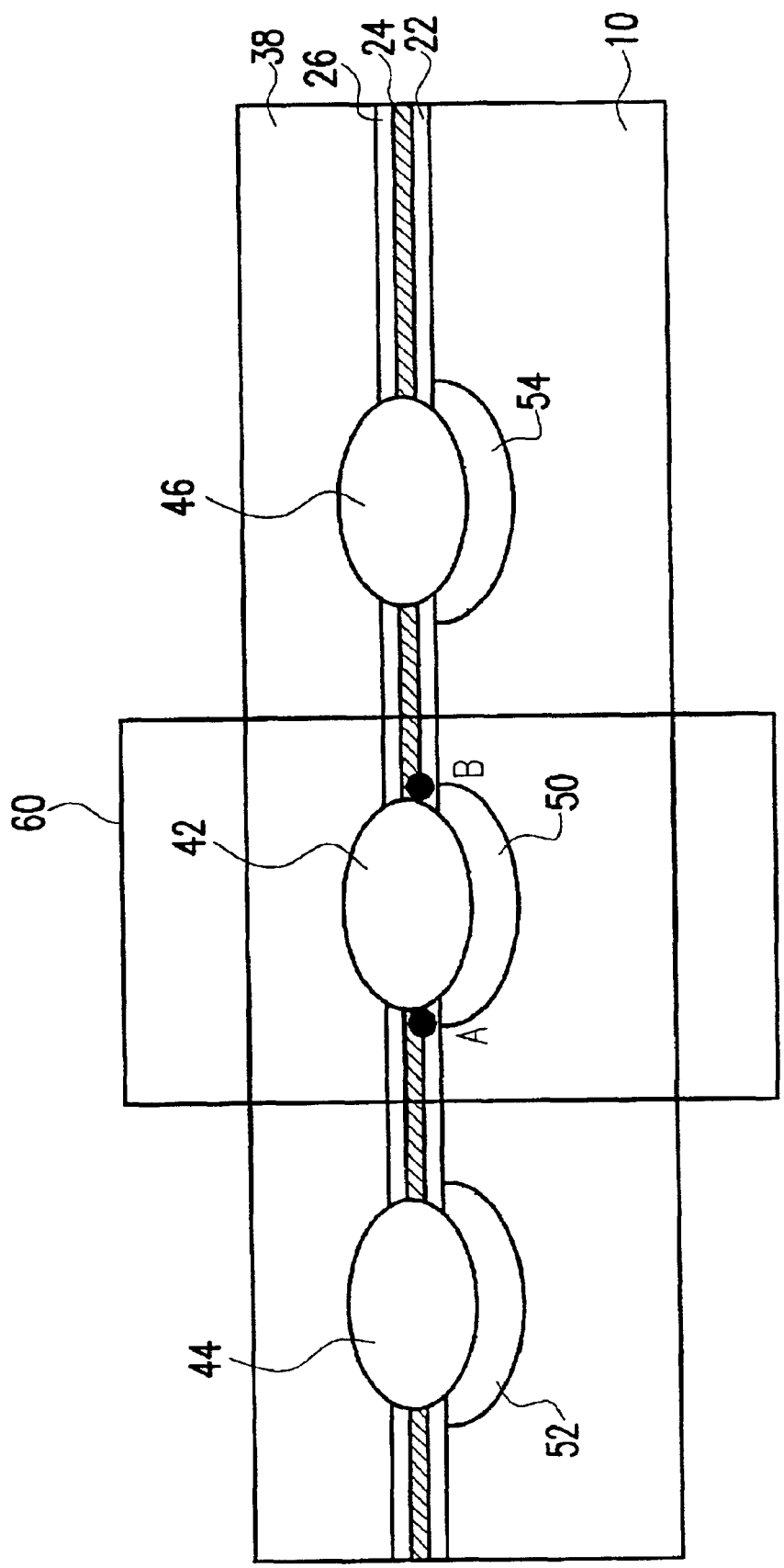
FIG. 2A shows a schematic cross-sectional view of a code cell in a flash ROM array.
Figure 2B:
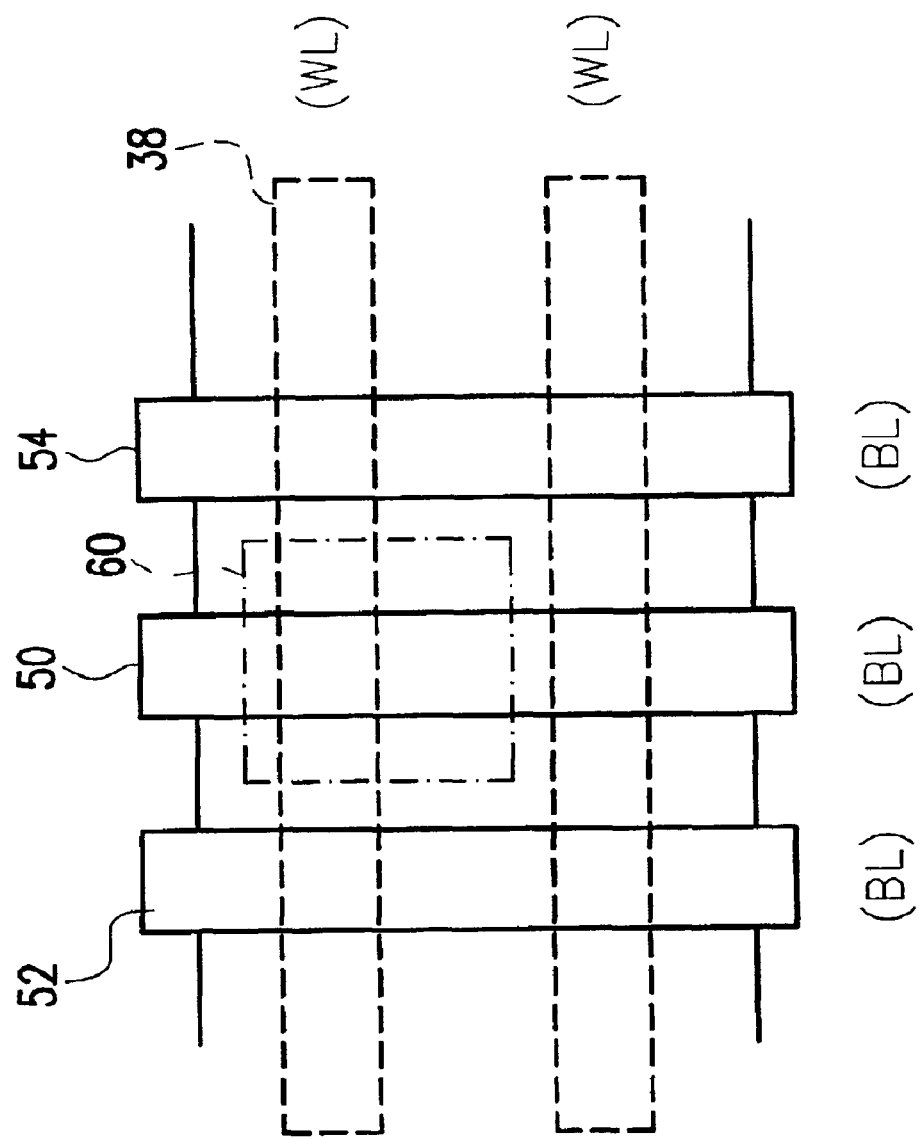
FIG. 2B shows a top view of the code cell in FIG. 2A.

FIG. 2A shows a schematic cross-sectional view of a code cell in a flash ROM array. FIG. 2B shows a top view of the code cell in FIG. 2A. Also, the code cell 60 is formed on a substrate 10. An oxide-nitride-oxide (ONO) layer is formed on the substrate 10, having the similar structure in FIG. 1A. Each code cell 60 can only store on bit data at the edge of its bit line 50, such as the locations A and B.

Followings are descriptions of program, erase and read operations for the code cell according to the invention. By means of the operations, the code cells of the flash ROM structure can be formed simultaneously with the data cells by a single and the same process.

Figure 3:
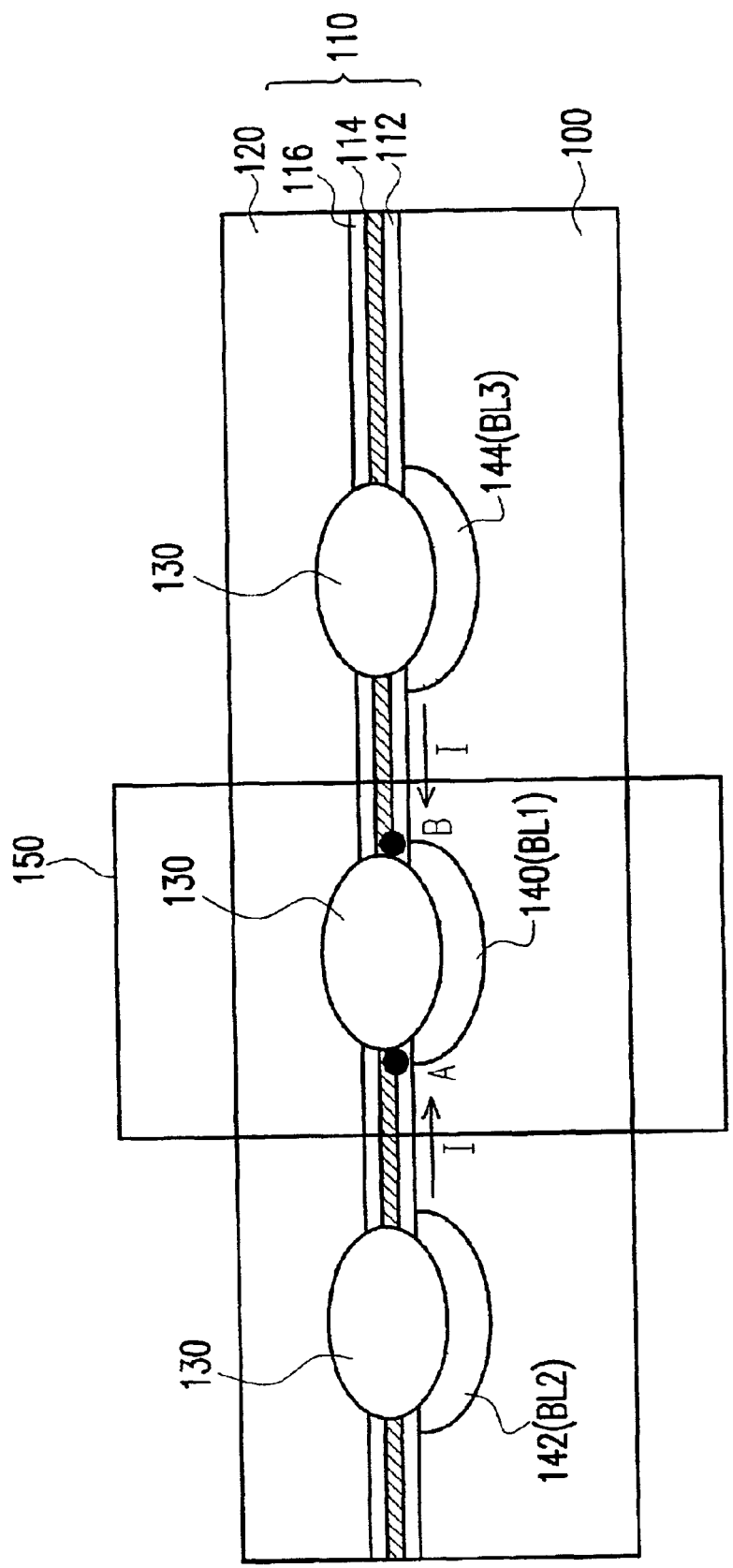
FIG. 3 shows a schematic cross-sectional view when a code cell is programmed.

FIG. 3 shows a schematic cross-sectional view when a code cell is programmed. As shown, a code cell 150 is fanned on a substrate 100. An oxide-nitride-oxide (ONO) layer 110, consisting of an oxide layer 112, a nitride layer 114 and an oxide layer 116, is farmed on the substrate 100. The material of the oxide layers 112, 116 can be silicon oxide and the oxide layer 112 is used as a tunneling oxide layer of the code cell 150. The material of the nitride layer 114 is silicon nitride for example and the nitride layer 114 is used as a charge trapping layer. In FIG. 3, bit lines BL1, BL2, and BL3 are respectively formed under isolation structures 130, such as buried oxide layers.

When the code cell 150 is programmed, the bit line BL1 corresponding to the code cell 150 to be programmed is served as the drain 140, and the bit lines BL2, BL3 next to the bit line BL1 are served as the sources 142, 144. Then, proper programming voltages are applied to the gate 120 (word line) and the drain 140 to program the code cell 150. For example, a positive high voltage is applied to the world line 120, a negative high voltage is applied to the bit line BL1 (the drain 140), and the bit lines BL2, BL3 are biased at voltages of zero. Because of the bias condition, from the source sides 142, 144, hot channel carriers (electrons for example) are injected into and trapped at locations A,B in the nitride layer 114 of the ONO layer 110 near both edges of the bit line BL1 because of a large electric field between the gate 120 and the drain 140. Namely, the hot channel electrons are trapped in the nitride layer 114 near both edges of the bit line BL1.

Figure 4:
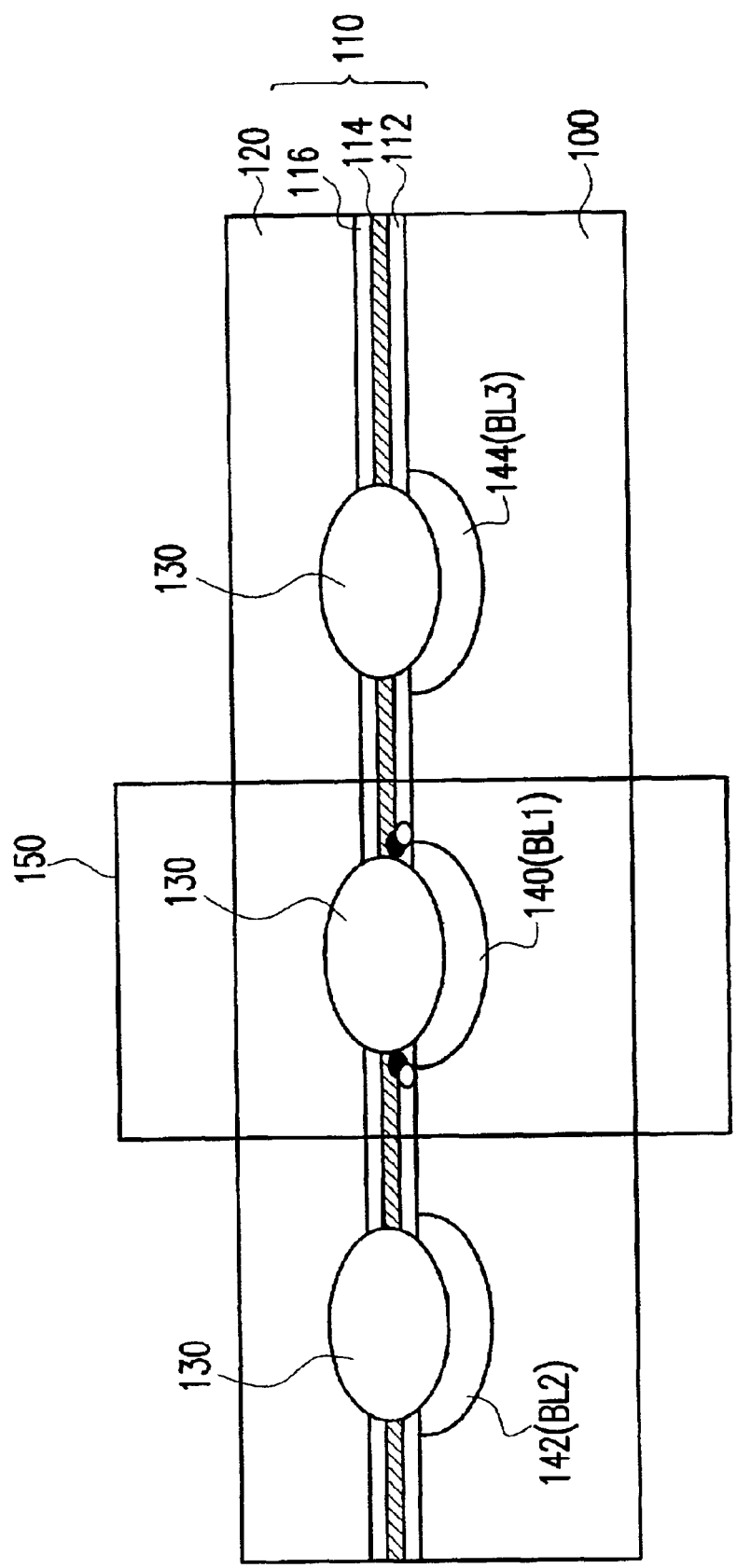
FIG. 4 shows a schematic cross-sectional view when a code cell is erased.

FIG. 4 shows a schematic cross-sectional view when a code cell is erased, and numerals same to those in FIG. 3 represent the same elements. As shown in FIG. 4, when the code cell 150 is programmed, the bit line BL1 corresponding to the code cell 150 to be erased is served as the drain 140, and the bit lines BL2, BL3 next to the bit line BL1 are served as the sources 142, 144. Then, proper erasing voltages are applied to the gate 120 (word line) and the drain 140 to erase the code cell 150. For example, a negative high voltage is applied to the world line 120, a positive high voltage is applied to the bit line BL1 (the drain 140), and the bit lines BL2, BL3 are biased at voltages of zero. Because of the bias condition, from the source sides 142, 144, hot channel carriers (holes for example), by the band-to-band tunneling effect, tunnel to and trapped at locations A,B in the nitride layer 114 of the ONO layer 110 near both edges of the bit line BL1 because of a large electric field between the gate 120 and the drain 140. Namely, the hot channel holes are trapped in the nitride layer 114 to compensate the electrons previously programmed into the nitride layer 114, thereby the code cell 150 is erased.

Figure 5:
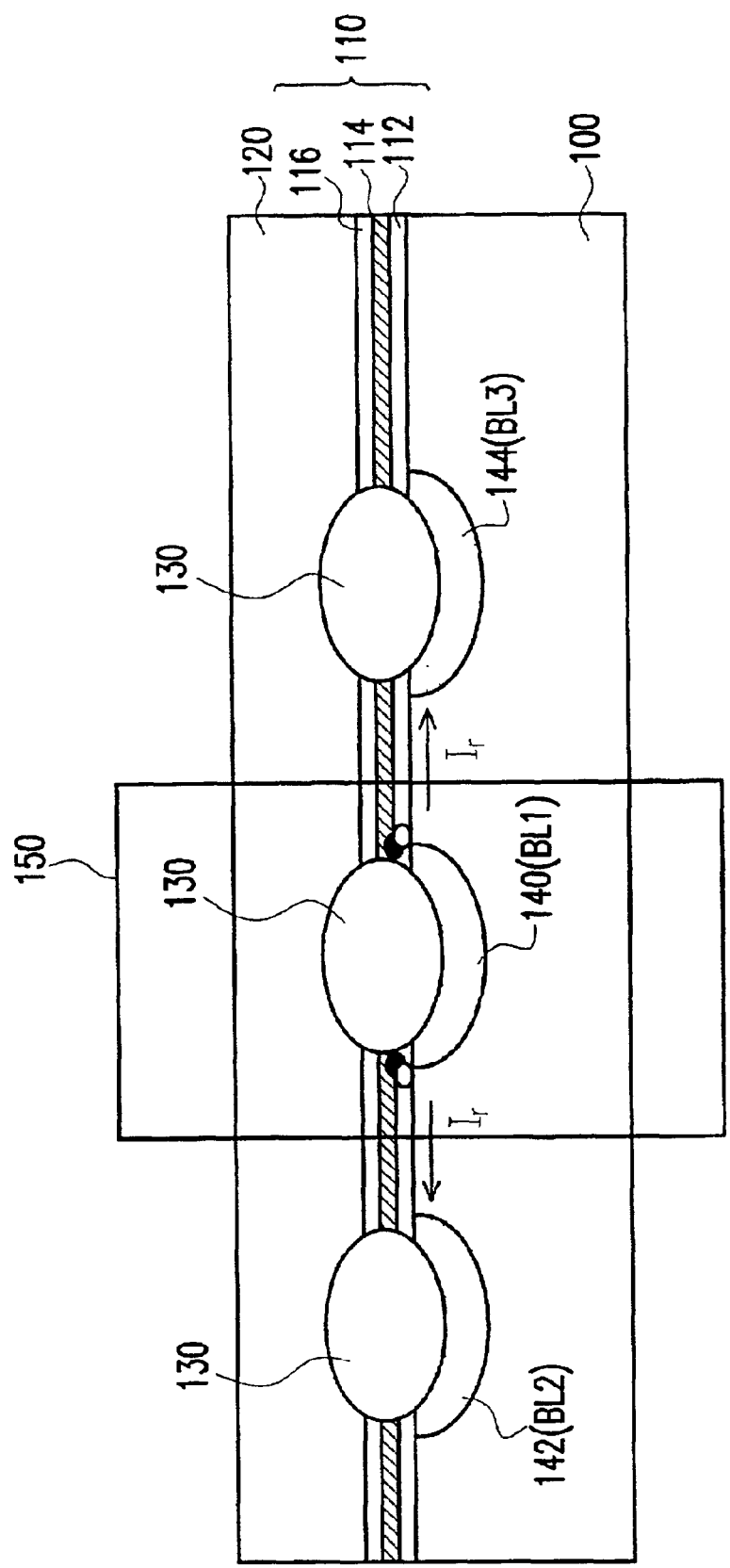
FIG. 5 shows a schematic cross-sectional view when a code cell is read.

FIG. 5 shows a schematic cross-sectional view when a code cell is read and numerals same to those in FIG. 3 represent the same elements. As shown in FIG. 5, when the code cell 150 is read, the bit line BL1 corresponding to the code cell 150 to be read is served as the drain 140, and the bit lines BL2, BL3 next to the bit line BL1 are served as the sources 142, 144. Then, proper read voltages are applied to the gate 120 (word line) and the sources 142, 144 to read the code cell 150. For example, read voltages are applied to the world line 120 and the bit lines BL2, BL3, and the bit line BL1 is biased at a voltage of zero. According to the read operation of the invention, read current Ir flow from the bit line BL1 to the bit lines BL2, BL3. Namely, each code cell has a dual channel structure (right and left in FIG. 5), and therefore the total read current is doubled.

According to the invention, the bit line BL1 corresponding to the code cell 150 to be programmed, erased or read is served as the drain, and the bit lines BL2, BL3 next to the bit line BL1 are served as the sources 142, 144, thereby the code cell is a dual channel structure. Namely, the invention alters the program and read operations for the code cell of the flash ROM array. During programming, electrons flow from sources to the drain, and then are trapped into the charge trapping layer (the nitride layer). On the other hand, during read, electrons flow from the drain to the sources next to the drain. Therefore, when the same read voltages are applied to the code cell, the read current of the invention can be considerably increased. The operational voltages and bias condition are listed in the table below.

|  | program | Erase | Read |
|---|---|---|---|
| gate (word line, WL) | positive high voltage | negative high voltage | read voltage |

-continued

|  | program | Erase | Read |
|---|---|---|---|
| drain (bit line, BL1) | negative high voltage | positive high voltage | 0 |
| source (bit lines BL1 BL3) | 0 | 0 | read voltages |

Figure 6:
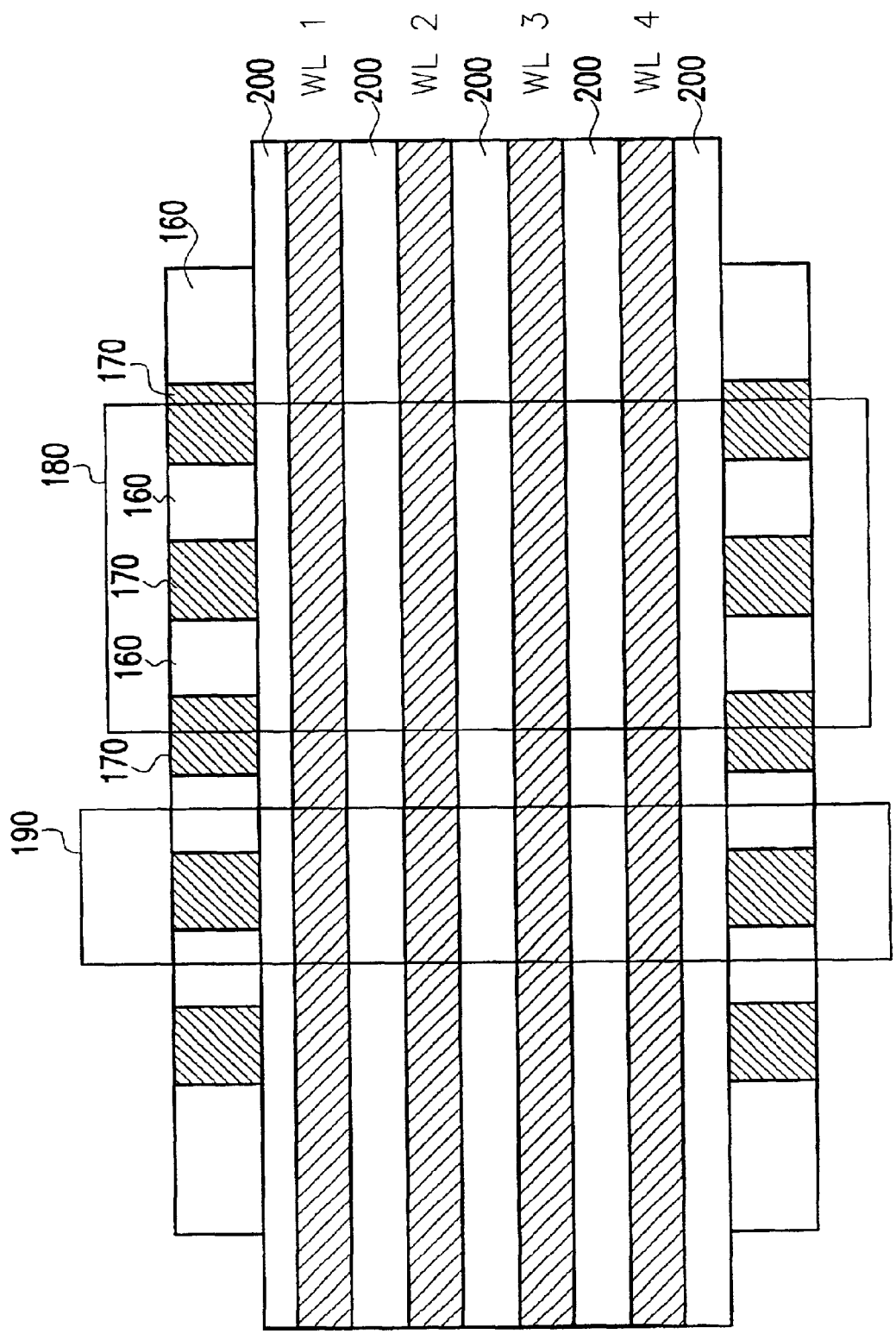
FIG. 6 shows a schematic top view of embedded flash ROM structure having a code cell region and a data cell region.

According to the operations of the code cell mentioned above, a single and the same process can be used to simultaneously form a data cell region and a code cell region in the flash ROM array. FIG. 6 shows a schematic top view of embedded flash ROM structure having a code cell region and a data cell region. The detail process for forming the flash ROM array is omitted, any suitable process can be used to form the flash ROM memory in FIG. 6 for those skilled in the art. As shown in FIG. 6, all the word lines and bit lines are formed first, for example the word lines WL1~WL4 and bit lines (not shown) under the buried oxide layer 160. The word lines are separated and isolated by insulating layers, for example spacer oxide layers 200.

Also referring to FIGS. 3 to 5, a substrate 100 is provided and then a plurality of bit lines (BL) are formed over the substrate 100. A plurality of isolation structures 160 are formed over the bit lines and a charge trapping layer 170 is formed between the isolation structures 160. A plurality of word lines (WL) are formed over the isolation structures 160 and the charge trapping layer 170 to form the embedded flash ROM structure. According to requirement, embedded flash ROM structure is divided into a code cell region 190 and a data cell region 180. The isolation structures above can be buried oxide layers for example. In addition, the charge trapping layer can be a three-layered insulating structure, such as an oxide-nitride-oxide (ONO) structure.

In summary, when the code cells are operated by the method of the invention, the code cells and data cells can be formed by a single and same process. Thereafter, the flash ROM structure is divided into the code cell region and the data cell region according to design requirements. Namely, a single and same process can be used for simultaneously forming the code cells and data cells in the flash ROM structure.

In addition, according to the invention, a cell that electrons are stored near the source/drain sides can be used as a two-bit data cell with a high storage capacity. In addition, a symmetrical dual channel structure can be used as a code cell so that electrons are stored at two edges of a bit line. Therefore, by applying the same read voltages to the code cell, the read current of the code cell is doubled.

While the present invention has been described with a preferred embodiment, this description is not intended to limit our invention. Various modifications of the embodiment will be apparent to those skilled in the art. It is therefore contemplated that the appended claims will cover any such modifications or embodiments as fall within the true scope of the invention.

What claimed is:

1. A programming method for a code cell of a flash ROM, the code cell has a first bit line served as a drain and a word line connected to the code cell, and a second and a third bit lines served as sources being located at two sides of the first bit line, the programming method comprising steps of:

applying a negative high voltage to the first bit line;
applying a positive high voltage to the word line; and
biasing the second and the third bit lines at zero voltages.

* * * * *